（12）United States Patent
Kavanagh et al.

(10) Patent No.: US 8,779,812 B1
(45) Date of Patent: Jul. 15, 2014

(54) HYBRID PLL/FLL CIRCUIT TO PROVIDE A CLOCK

(71) Applicant: Texas Instruments Incorporated, Dallas, TX (US)

(72) Inventors: Peter Michael Kavanagh, San Jose, CA (US); Andrew Khar Boon Ong, Glasgow (GB)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/780,173

(22) Filed: Feb. 28, 2013

(51) Int. Cl.
H03L 7/06 (2006.01)
(52) U.S. Cl.
USPC .......................................... 327/150; 327/156
(58) Field of Classification Search
CPC ..... H03L 7/0995; H03L 7/148; H03L 7/0891; H03L 7/1976; H03L 7/07; H03L 7/091; H03L 7/087; H03L 7/093; H03L 7/095; H03L 2207/50; H03L 7/0814; H03L 7/18; H03L 7/089; H03L 7/099; H03L 7/235; H03L 7/0992; H03L 7/085; H03L 7/0812; H03L 2207/06; H03L 7/08; H03L 7/197; H03L 2207/08; H03L 7/113; H03L 7/187; H03L 7/191
USPC .......... 327/150, 115, 156–158, 147, 248, 40, 327/105, 140, 144, 148, 239, 245, 42; 375/355, 376, 260, 326, 354, 374, 375; 340/572.1, 10.1, 10.4, 10.2, 10.33, 340/572.4

See application file for complete search history.

(56) References Cited

U.S. PATENT DOCUMENTS

| 5,512,860 | A | * | 4/1996 | Huscroft et al. | ............... | 331/1 A |
| 6,310,521 | B1 | * | 10/2001 | Dalmia | .......................... | 331/11 |
| 6,526,113 | B1 | * | 2/2003 | Gutierrez et al. | ............. | 375/376 |
| 8,222,933 | B2 | | 7/2012 | Nagaraj | | |
| 2004/0190669 | A1 | * | 9/2004 | Gutierrez et al. | ............. | 375/376 |
| 2009/0041173 | A1 | | 2/2009 | Lin | | |

OTHER PUBLICATIONS

Wolfson Microelectronics plc, "Low Power Audio System with Wolfson myZoneTM Ambient Noise Cancellation and Echo Cancellation", WM5110, Product Brief, Sep. 2012, Rev. 2.0.

* cited by examiner

Primary Examiner — Lincoln Donovan
Assistant Examiner — Diana J Cheng
(74) Attorney, Agent, or Firm — Alan A. R. Cooper; Frederick J. Telecky, Jr.

(57) ABSTRACT

Clock circuits are presented for providing a clock signal using multiple reference clock signals, including a PLL operating from a PLL reference clock signal, an FLL operating from an FLL reference clock signal, and a multiplexer circuit that selectively provides up and down signals from either a PFD of the PLL or the FLL to a charge pump of the PLL according to a reference clock select signal.

19 Claims, 6 Drawing Sheets

HYBRID PLL/FLL CIRCUIT TO PROVIDE A CLOCK

FIELD OF THE INVENTION

The present disclosure relates to clock circuits, and more particularly to hybrid phase lock loop (PLL)/frequency lock loop (FLL) circuits to provide a clock based on one of a plurality of reference clock sources.

BACKGROUND

Digital and Mixed Signal circuitry typically uses clock signals including a system clock and clocks derived from the system clock. PLL, delay lock loop (DLL) or FLL circuits are employed to compare the system clock with a reference clock source, and to adjust the frequency of the system clock to ideally match or "lock" the system clock frequency with that of the reference. Cell phones and other portable electronic devices are often designed to operate at different clock frequencies. For example, a cell phone may change from a 2.5G network to a 3G network, requiring switch over from one reference clock/PLL circuit to another. Other examples include redundant clock systems in which a primary reference clock source may be disabled requiring switch over to a different reference source, or MP3 track sample rates may change in an audio device. In such cases, conventional clock circuits provide a dedicated PLL or FLL for each reference clock source, and multiple sets of reference clock sources and corresponding PLL or FLL circuits are needed. In addition, a clock handover circuit is required, which can lead to a few clock cycles of glitch during the handover. Moreover, changing from the output of one PLL to another PLL associated with the backup or secondary reference clock source requires the system to undergo transitory circuit behavior or glitch while output of the new clock reference/PLL circuit settles. Thus, a need remains for improved low cost clock circuits operable according to one of a plurality of reference clock sources while mitigating glitch and settling time associated with conventional clock handover circuits.

SUMMARY

The present disclosure provides clock circuits that can be employed to provide a clock signal using one of two or more reference clock signals. The circuitry includes a PLL or other primary locking circuit operating from a PLL reference clock signal, as well as an FLL operating from an FLL reference clock signal, and a multiplexer that selectively provides a charge pump of the PLL with up and down signals from either a phase frequency detector (PFD) of the PLL or from the FLL according to a select signal. Integrating the FLL into the control loop of the PLL facilitates switching from one reference clock to another without the disruptions and glitch associated with conventional clock handover circuit approaches, while reducing the amount of circuitry required to selectively operate a digital system from different reference clock sources.

One or more aspects of the present disclosure relate to circuits for providing a clock signal according to one of a plurality of reference clock signals. The circuitry includes a PLL or other primary locking circuit with a phase frequency detector receiving a first reference clock signal and a feedback clock signal, as well as a charge pump or other oscillator control circuit and a controlled oscillator such as a voltage controlled oscillator (VCO), a digitally controlled oscillator (DCO), etc., that generates an oscillator output clock signal according to a control signal from the oscillator control circuit. The circuit further includes one or more FLLs receiving a second reference clock signal, and a multiplexer that provides up and down signals from one of the primary locking circuit (PLL) and the FLL to the charge pump (or other oscillator control circuit) in order to adjust the controlled oscillator output clock signal. The multiplexer in certain embodiments can include a first multiplexer for selecting among up signals from the PLL and the FLL, as well as a second multiplexer for selecting among down signals from the PLL and the FLL. In addition, the PLL may include a low pass filter circuit between the charge pump and the input of the controlled oscillator. The FLL in certain embodiments includes an edge detector providing rising and falling edge output signals based on detected edges in the FLL reference clock signal, as well as a frequency estimator circuit providing a frequency estimate output value based at least partially on the rising and falling edge output signals, with a Sigma-Delta modulator (SDM) that provides the FLL up and down signals according to the frequency estimate. Certain embodiments of the FLL further include an error accumulator circuit which provides a frequency error output value, where the SDM provides the FLL up and down signals according to the frequency estimate output value and the frequency error output value.

DESCRIPTION OF THE VIEWS OF THE DRAWINGS

The following description and drawings set forth certain illustrative implementations of the disclosure in detail, which are indicative of several exemplary ways in which the various principles of the disclosure may be carried out. The illustrated examples, however, are not exhaustive of the many possible embodiments of the disclosure. Other objects, advantages and novel features of the disclosure will be set forth in the following detailed description when considered in conjunction with the drawings, in which.

DETAILED DESCRIPTION

Figure 1:
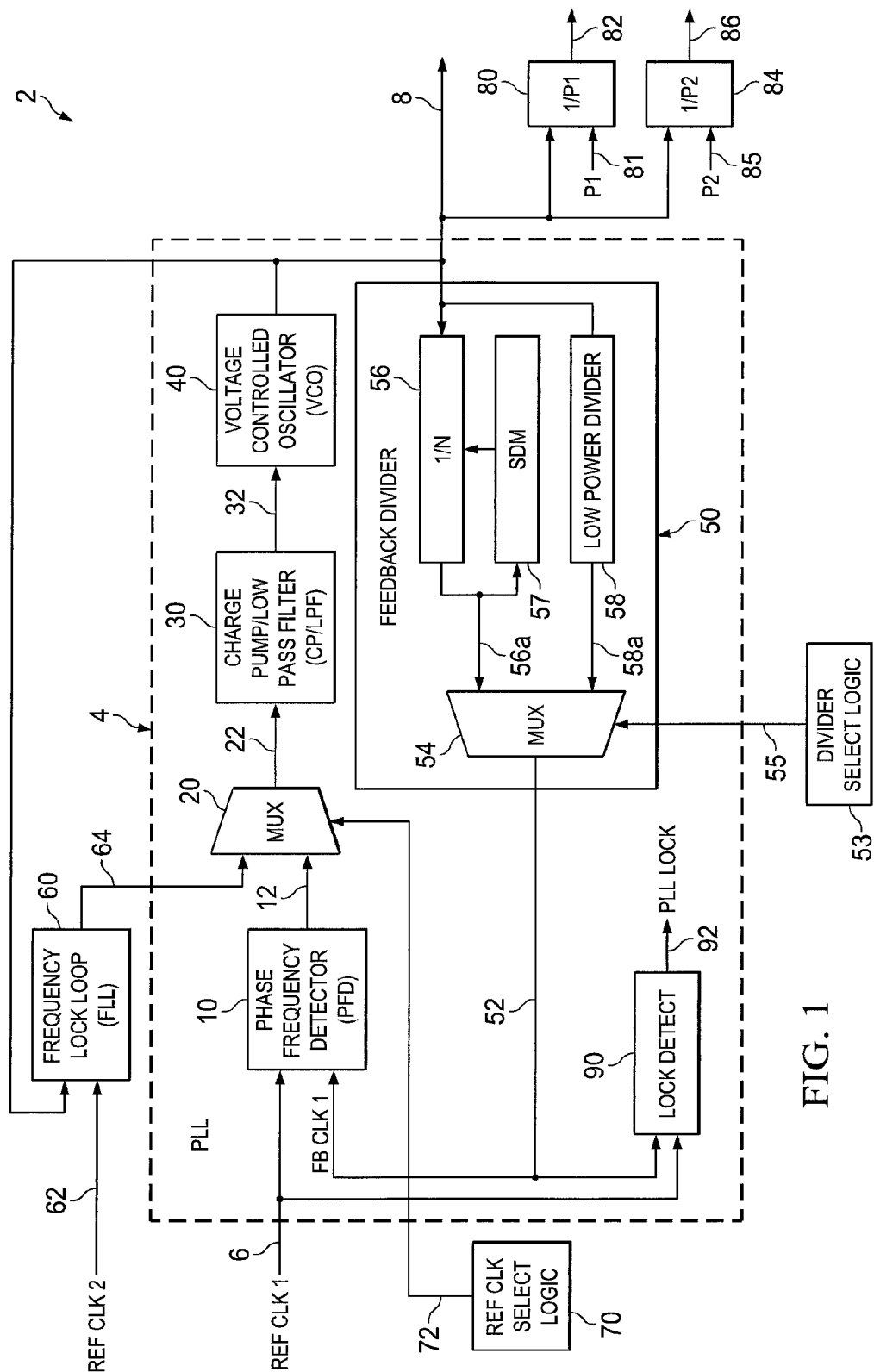
FIG. 1 is a schematic diagram illustrating an exemplary hybrid PLL/FLL circuit operable according to one of two reference clock sources.

One or more embodiments or implementations are hereinafter described in conjunction with the drawings, wherein like reference numerals are used to refer to like elements throughout, and wherein the various features are not necessarily drawn to scale. The present disclosure provides clock circuits and systems for generating clock signals using one of a plurality of reference clock signals, and is illustrated and described in the context of exemplary hybrid PLL/FLL circuitry 2 using either a first reference clock signal 6 or a second reference clock signal 62. It will be appreciated, however, that further embodiments are contemplated within the scope of the present disclosure in which any number of two or more reference clock signals can be used in a hybrid PLL/FLL circuit, wherein the scope of the present disclosure is not limited by the illustrated examples. The illustrated circuitry 2, moreover, may be integrated with a host circuit, such as in a codec or other integrated circuit, or may be provided as a separate IC in various embodiments, and the FLL controls may be managed in firmware in certain implementations, via a multifunction timer to monitor the controlled oscillator speed.

FIG. 1 shows an exemplary clock circuit 2 having a primary locking circuit 4, illustrated in the figures as a phase lock loop 4 (alternatively referred to as a phase "locked" loop or PLL) with a phase frequency detector (PFD) 10 operating according to a first reference clock signal 6 and a feedback clock signal (FB CLK 1) 52, along with a multiplexer 20, an oscillator control circuit 30, shown in the examples as a charge pump/low pass filter circuit (CP/LPF) 30, a controlled oscillator (e.g., VCO, DCO, etc.) 40 in a forward circuit path, and a feedback circuit 50. The clock circuit 2 also includes a frequency lock loop (alternatively referred to as a frequency "locked" loop or FLL) 60 operated according to a second reference clock signal 62 and an FLL feedback signal 8, 8a, where the illustrated example uses the oscillator output clock signal 8 from the VCO 40 as a feedback clock signal, with the FLL 60 including an internal frequency divider 69 (FIG. 3 below) providing a divided feedback signal 8a. Any suitable primary locking circuit 4 can be employed, including without limitation a PLL circuit is illustrated in the exemplary embodiments, a delay lock loop (DLL) circuit, or other circuit that facilitates locking of an output clock signal to the frequency of a primary reference clock. Also, any suitable oscillator control circuit 30 can be used, including without limitation a charge pump circuit (with or without corresponding low pass filter) as illustrated and described herein, as well as digital signals provided to a digital to analog converter (DAC), controls to counters in a DLL type primary locking circuit, etc.

As best seen in FIG. 1, certain embodiments of the feedback circuitry 50 in the PLL 4 include a 1/N feedback divider circuit 56 which divides the oscillator output clock signal 8 by an integer value N to provide the PLL feedback clock signal 52 to the PFD 10 as a first divided oscillator output clock signal 56a at a frequency lower than that of the oscillator output signal 8. The divisor integer value N can be fixed, or may be variable (e.g., programmable) in certain embodiments, for example, with a default value of 34. In addition, the feedback circuit 50 includes a feedback divider Sigma-Delta modulator (SDM) circuit 57 which adjusts the control of the divider circuit 56. Unlike simple feedback divider circuitry, the illustrated example provides a high-quality feedback clock signal 52 via operation of the SDM 57 in conjunction with the divider 56.

The illustrated example of FIG. 1 also includes a low power divider circuit 58 which divides the oscillator output 8 to a second divided oscillator output clock signal 58a at an even lower second frequency, where the division factor of the low-power divider 58 may likewise be programmable. The low-power divider 58 may be used in practice to implement commonly used divide values in hardware, for example, a verbal divider for powers of 2. In one embodiment, for instance, the low-power divider divides the oscillator output clock signal 8 by default factor of 32 to derive a divided value 58a. As seen in the example of FIG. 1, moreover, the feedback circuit 50 includes a multiplexer 54 receiving the divided clock signals 56a and 58a and providing a selected one of these as the feedback clock signal 52 for use by the PFD. The multiplexer 54, moreover, operates according to a divider select signal 55 provided by a divider select logic circuit 53, which can be integral to the clock circuitry 2 in certain embodiments. For instance, control of the multiplexer circuit 20 is done by the PLL 4 in certain implementations to provide a certain amount of dead time while the FLL outputs 64 become valid, with the PLL control circuitry optionally holding the oscillator input voltage 32 while waiting for a reference clock signal.

The PLL 4 further includes a lock detect circuit 90 which provides a PLL LOCK output signal 92 to the host system. The lock detect circuit 90 compares the PLL feedback lock signal 52 and the PLL reference clock signal 6, and if these are within a predetermined (or programmable) threshold phase and/or frequency amount of one another, provides the lock signal 52 (e.g., a binary signal either active high or active low) in order to indicate to a host system that the oscillator output clock signal 8 is substantially locked to the PLL reference clock signal 6. In certain embodiments, moreover, the FLL 60 can be always enabled in certain implementations to monitor the oscillator output clock 8 from the PLL 4. In this manner, the outputs of the FLL frequency estimator (estimator 63 illustrated and described below in connection with FIGS. 3 and 5) can be readable in the system 2. This provides a useful backup to the conventional PLL lock detect monitor 90 in certain embodiments.

In various implementations, the oscillator output clock signal 8 provided by the exemplary controlled oscillator (e.g., VCO) 40 can be used as a general clock signal, and the clock circuit 2 may (but need not) provide one or more divider circuits 80, 84 to provide divided clock signals 82, 86 at lower frequencies for use in a host system. As shown in FIG. 1, for instance, a first divider circuit 80 divides the clock signal 8 by a first integer value P1, and the divider circuit 80 may receive the divisor value 81 as an input, e.g., from the host system. Similarly, the second divider circuit 84 may receive a second divisor value P2 as an input 85.

In operation, the circuit 2 provides up and down signals 22 from the multiplexer 20 to the charge pump and low pass filter 30 to provide adjustment to a voltage control signal 32 in order to set the output phase and frequency of the VCO 40. Consequently, the oscillator output clock signal 8 is adjusted according to feedback from either the PFD 10 or the FLL 60. In particular, the multiplexer 20 provides the up and down outputs 22 according to FLL up and down signals 64 or PLL up and down signals 12 according to a reference clock select signal 72 provided by a reference clock select logic circuit 70. In various different implementations, the reference clock select logic 70 may be logic of a host system, or may be any suitable logic receiving one or more inputs by which a decision is made as to whether to use the up and down signals from the PFD 10 or from the FLL 60. In this manner, the circuit 2 provides the output clock 80 and derivatives thereof according to either the first reference clock 6 or the second reference clock 62 based on the reference clock select signal 72. Moreover, the shared use of the charge pump 30 and the VCO 40 advantageously avoids or mitigates switchover glitch and/or loss of signal as was the case for conventional clock switchover approaches which provided separate PLL or FLL circuitry for each reference clock source.

Figure 2:
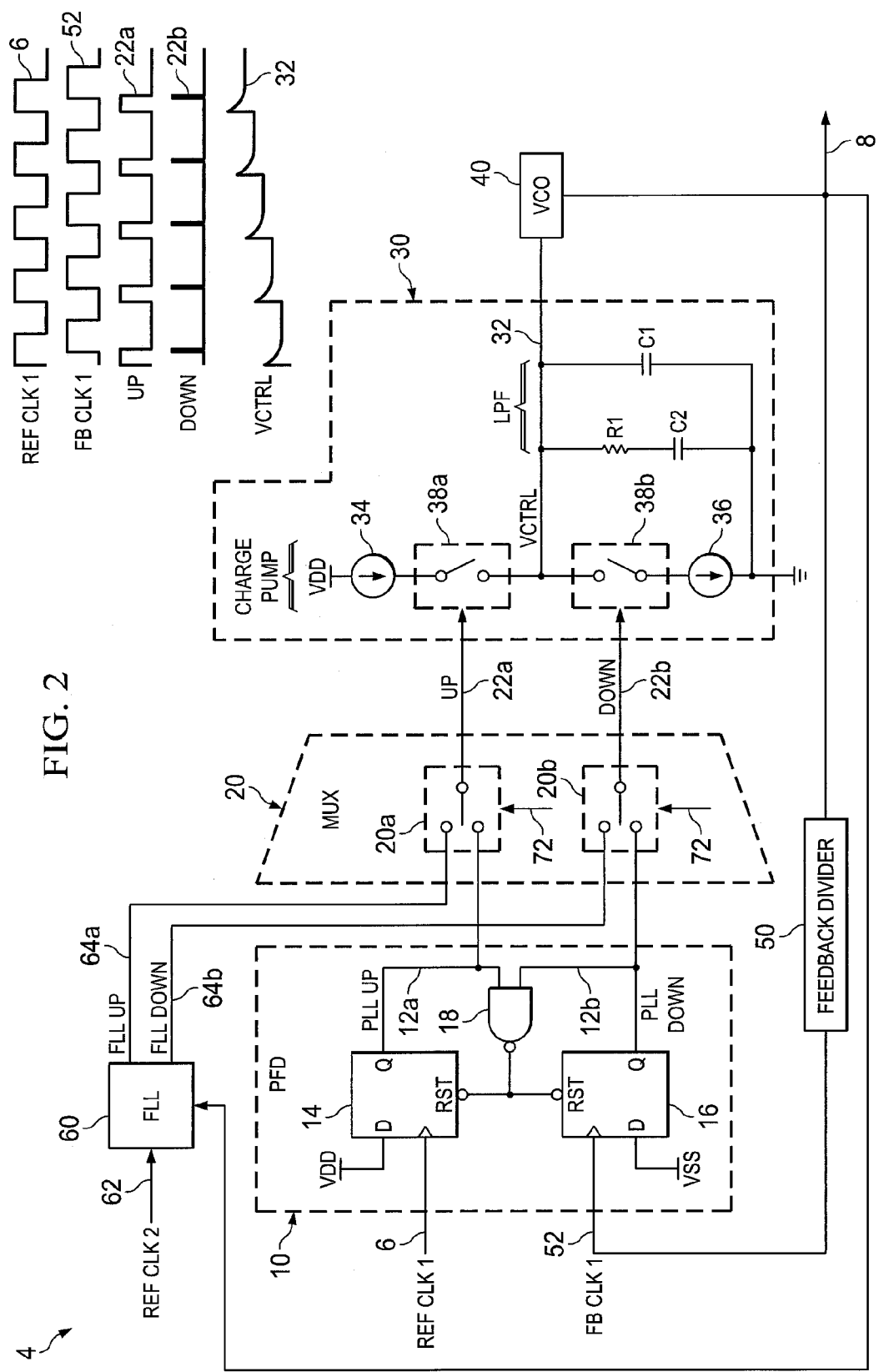
FIG. 2 is a schematic diagram illustrating further details of the exemplary PLL circuitry.

Referring also to FIG. 2, the PFD 10 of the PLL 4 is configured to provide PLL up and down output signals 12a and 12b, respectively, according to the PLL reference clock signal 6 and the feedback clock signal 52, where a variety of different circuit implementations can be employed to implement the PFD 10. In the simplified non-limiting example of FIG. 2, for instance, first and second D flip-flops 14 and 16 and a NAND gate 18 are used, with the first reference clock 6 connected to the clock input of the flip-flop 14, the feedback clock signal 52 connected to the clock input of the flip-flop 16, the data (D) inputs of the flip-flops 14 and 16 connected to a positive voltage VDD and a lower voltage VSS, respectively. The flip-flops 14 and 16 are reset by the active low output of the NAND gate 18, whose inputs are connected to the PLL up and PLL down signals 12a and 12b at the Q outputs of the respective flip-flops 14 and 16. Other forms and configurations of PFD circuits 10 can be used, wherein the present disclosure is not limited to the illustrated example of FIG. 2. The PFD circuit 10 thus provides up and down output signals 12 based on comparison of the first reference clock 6 with the PLL feedback clock signal 52.

The PFD output signals 12a and 12b are provided as inputs to a dual channel multiplexer 20 (e.g., a pair of multiplexer circuits 20a and 20b in the illustrated example), with the PLL up signal 12a being input to a first multiplexer 20a and the PLL down signal 12b providing an input to a second multiplexer 20b. As seen in FIG. 2, moreover, the other up and down inputs to the multiplexer circuit 20 are provided by the FLL 60 as an FLL up signal 64a and an FLL down signal 64b. The multiplexer circuits 20a and 20b can be any suitable form of electronic switching circuit operative according to the select signal 72, for example, using transistor circuits as are known. The circuit 2 thus employs a PLL topology 4 with an additional FLL control loop 60, either of which can control the shared charge pump 30 via the multiplexer 20 according to the reference clock select signal 72. In one possible implementation, the PLL 4 is used with a high frequency (e.g., 0.5 MHz to 50 MHz) first reference clock signal 6 when the primary reference is available, and the FLL Loop 60 uses a low frequency reference clock signal 62 (e.g., 4 kHz to 500 kHz) and the reference select logic 70 switches the multiplexer 20 from PLL operation to FLL operation when the PLL reference clock signal 6 is unavailable. As discussed above, moreover, other situations can initiate a switch between high-frequency (PLL) mode operation and lower frequency (FLL) mode operation, such as a cell phone transitioning from a 2.5G network to a 3G network.

The outputs 22 of the multiplexer circuit 20 are provided to a circuit 30 which operates to selectively increase, decrease or maintain a control voltage VCTRL 32 provided to the VCO 40 accordingly. In this regard, any suitable circuitry 30 can be used to provide such control voltage up and down control, for example, a charge pump as illustrated in FIG. 2, digital signals provided to a digital to analog converter (DAC, not shown), controls to counters in a delay lock loop (DLL, not shown), etc. The multiplexer 20 in the illustrated non-limiting example of FIG. 2 selectively provides one set of the signals 12 or 64 as up and down output signals 22a and 22b to the charge pump 30. The charge pump 30 includes a first current source 34 coupled between the positive voltage VDD and a first charge pump switching circuit 38a, and the first switching circuit 38a is connected between the current source circuit 34 and a control output voltage terminal 32 (labeled VCTRL in FIG. 2). A second switching circuit 38b is connected between the control output 32 and a second current source 36, which in turn is coupled to a circuit ground. A low pass filter is optionally provided at the output of the charge pump, in one example including a first capacitor C1 (e.g., 6 pF in one example) connected between the control output terminal 32 and the circuit ground, with a first resistor R1 (e.g., 55 kΩ) in series with a second capacitor C2 (e.g., 78 pF) in parallel with C1. The charge pump 30 provides the control voltage output signal 32 according to the received up and down input signals 22a and 22b by selective operation of the switch circuits 38a and 38b to connect the corresponding current sources 34 and 36 to the output terminal 32. By this operation, the control voltage VCTRL at the output 32 is selectively increased or decreased according to the relationship of the corresponding reference and feedback clock signals associated with the selected up and down signal source.

The waveforms of FIG. 2 illustrate an example in which the PFD 10 provides the charge pump up and down signals 22, in which the control output voltage 32 is initially increased by the up signal 22a, and then slightly decreased by the down signal 22b in the case where the first reference clock signal 6 is slightly leading the feedback clock signal 52. In this manner, the control voltage 32 is steadily increased in order to increase the upper frequency of the VCO 40 whereby the oscillator output clock signal 8 and the corresponding feedback signal 52 tends to align in phase with the first reference clock signal 6. Similar but opposite operation is found where the reference signal 6 lags the feedback signal 52. In closed loop fashion, the PLL circuit 4 thus operates to lock the VCO output 8 with the first reference clock 6 when the select signal 72 is such that the PLL up and down output signals 12a and 12b are provided as the multiplexer outputs 22a and 22b, respectively. It will be appreciated that similar operation of the charge pump provides the control signal 32 to the VCO 40 when the multiplexer circuit 22 provides the FLL up and FLL down signals 64 as inputs 22 to the charge pump 30.

The disclosed clock circuit 2 provides significant advantages over conventional systems in which a clock handover circuit was provided to switch from the output of a first reference clock/PLL circuit pair to another reference clock/PLL pair for generating a clock signal. In particular, such conventional system suffer from time delay to allow for the newly selected reference clock/PLL output to settle or stabilize, and typically exhibit excessive clock signal glitch during clock handover. The hybrid PLL/FLL approach described herein advantageously avoids having to provide separate PLL circuits for each reference clock source, and thus only two additional multiplexer circuits (e.g., 20a and 20b in FIG. 2 above) are added to the circuitry of the host system. In addition, the use of an FLL 60 facilitates operation with secondary reference clock sources of fairly low frequencies (e.g., down to about 4 kHz in certain examples), whereas standard PLL circuits are generally less compatible with such low frequency clocks. Moreover, the described circuitry 2 facilitates dynamic switching between PLL and FLL operational modes without incurring significant glitch or loss of clock pulses, particularly due to the shared usage of the charge pump 30 and the VCO 40, whereby the circuit 2 provides significant performance advantages over conventional techniques. As a possible trade-off, power consumption during operation with the FLL 60 can be similar to that found with operation of a separate PLL for a secondary reference clock.

Figure 3:
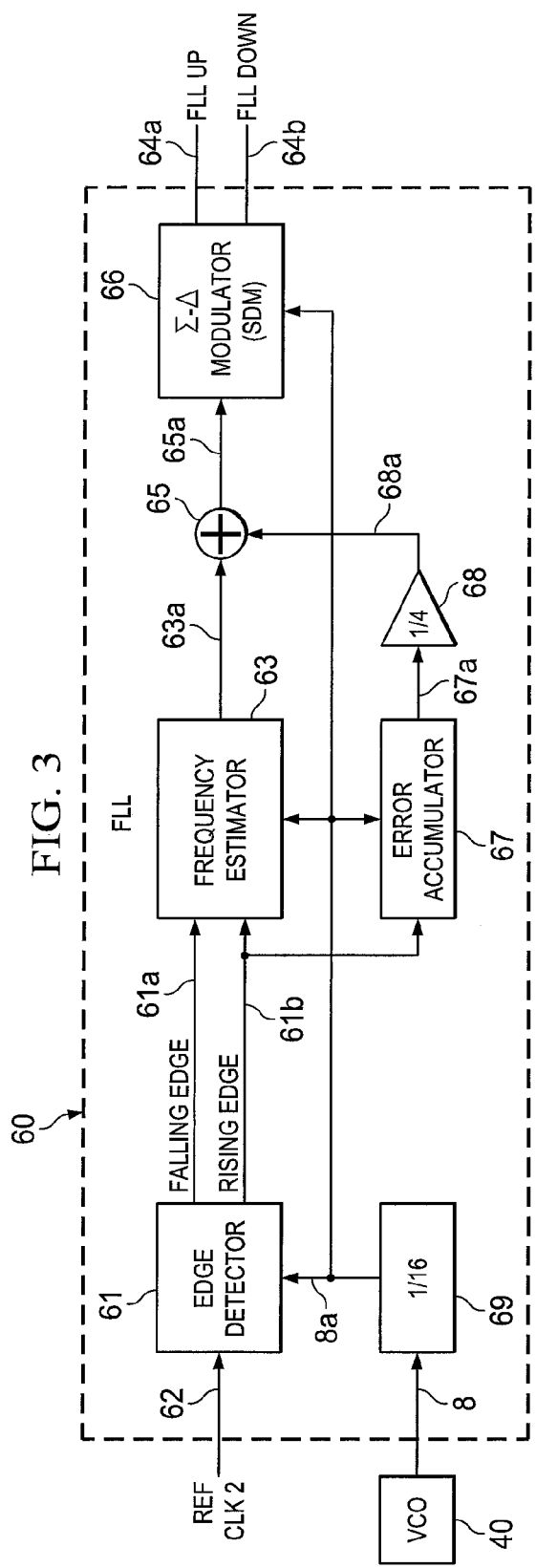
FIG. 3 is a schematic diagram illustrating further details of the FLL in FIG. 1.

Referring also to FIG. 3, an exemplary FLL circuit 60 is illustrated, including inputs to receive a second (FLL) reference clock signal 62 and the FLL feedback clock signal 8, as well as outputs providing an FLL up signal 64a and an FLL down signal 64b for selective use by the multiplexer 20. In the illustrated implementation, the FLL includes an internal feedback divider circuit 69 which divides the VCO output 8 by a divisor value (e.g., 16). In various implementations, the divisor for the divider circuit 69 can be any suitable value, and may be a programmable variable. The divider 69 provides a divided FLL reference clock signal 8a to an edge detector circuit 61 (see also FIG. 4) at a frequency lower than that of the FLL feedback clock signal 8. The divided FLL reference clock signal 8a is also provided to a frequency estimator circuit 63 (FIG. 5), an error accumulator circuit 67 (FIG. 6), and an FLL SDM circuit 66 (FIG. 7). As discussed above, the FLL 60 and the second reference clock 62 may be used for a variety of reasons, including changes of MP3 track sample rate, a switch from a 2.5G network to a 3G network for a cell phone host system, and/or for situations in which the primary reference clock signal 6 is disabled. In this regard, the second reference clock signal 6 may be a relatively higher frequency signal than is the second reference clock signal 62, although the FLL 60 can operate with high frequency clock sources as well.

The edge detector circuit 61 provides the falling edge output signal 61a in response to detection of falling edges in the divided FLL reference clock signal 62, and provides the rising edge output signal 61b in response to detection of rising edges in the signal 62. Falling and rising edge signals 61 are provided to a frequency estimator 63 which provides a frequency estimate output value 63a representing frequency of the feedback clock signal 8 (or the divided feedback clock signal 8a) based on the falling and rising edge signals 61. An error accumulator 67 provides a frequency error output value 67a representing a frequency error in the feedback clock signal 8 or 8a, which is then divided in certain implementations by a divider circuit 68 (e.g., divided by 4 in one example for damping to reduce ringing in the FLL 60). In certain implementations, a gain/attenuation circuit can be substituted for the divider circuit 68 for improving the stability such as by adjusting poles and/or zeros or other filtering functions, or such can be provided in combination with a divider. The divided and/or filtered signal 68a is provided as an input to a summer 65 along with the frequency estimate output value 63a. The sum of the signals 63a and 68a is provided as an input signal 65a to an FLL SDM circuit 66, which provides the FLL up and down output signal 64a and 64b to the FLL inputs of the multiplexer 20 (FIGS. 1 and 2). The FLL 60 thus compares the VCO output signal 8 (or a divided version 8a thereof) to the second frequency reference clock signal 62 and produces a value at the output 65a of the summer 65 that is proportional to the difference. In one embodiment (e.g., FIG. 7 below), the SDM circuit 66 includes a 3 level quantizer that can operate the charge pump 30 to move the VCO oscillator output signal frequency up or down or leave it unchanged.

Figure 4:
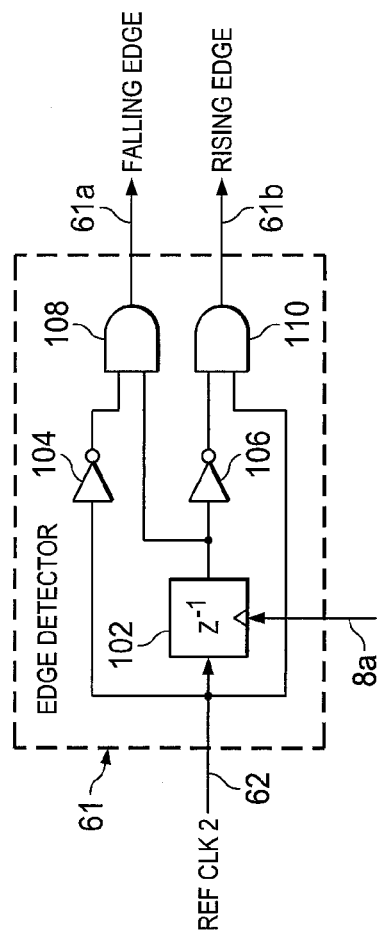
FIG. 4 is a schematic diagram illustrating an exemplary edge detector in the FLL of FIGS. 1 and 3.

FIG. 4 shows a simplified edge detector circuit 61 for illustration purposes which may be used in the FLL 60 of FIG. 3 along with suitable meta-stability protection circuitry (e.g., SR laches or a pair of flip-flops to ensure correct clock domain crossing, etc.), where such details are omitted from the drawing so as to avoid obscuring the various aspects of the present disclosure. In this implementation, the edge detector circuit 61 includes a storage element 102 (indicated as a $Z^{-1}$ circuit), as well as two Boolean inverters 104 and 106 and AND Gates 108 and 110 providing the falling edge and rising edge outputs 61a and 61b, respectively. The storage element 102 is clocked by the divided VCO output signal 8a, and the storage element 102 can be a single-bit register in certain implementations. The second reference clock signal 62 is provided to the input of the storage element 102, as well as to a first inverter 104 and to a second input of the AND gate 110. The edge detector circuit 61 determines the rising edge and falling edge, via sampling at the frequency of the divided VCO signal 8a (e.g., VCO/16). This provides fast edge creation/detection with respect to the FLL reference clock signal 62 since the divided VCO signal 8a is typically of a much higher frequency than the reference 62. As the reference clock 62 is received, the storage block 102 stores the current state of the clock 62. In operation, the edge detection circuit determines if the reference clock 62 was low before, and then goes high, and outputs an active signal to the rising edge output 61b (e.g., active high). If the reference clock 62 was high before, and then goes low, the falling edge output 61a goes active high. Therefore, each time there is a rising edge on the reference clock 62, there will be a pulse (data equals binary 1) on the rising edge output 61b. Likewise, each time there is a falling edge on the reference clock 62, there will be a pulse (data equals binary 1) on the falling edge output 61a.

Figure 5:
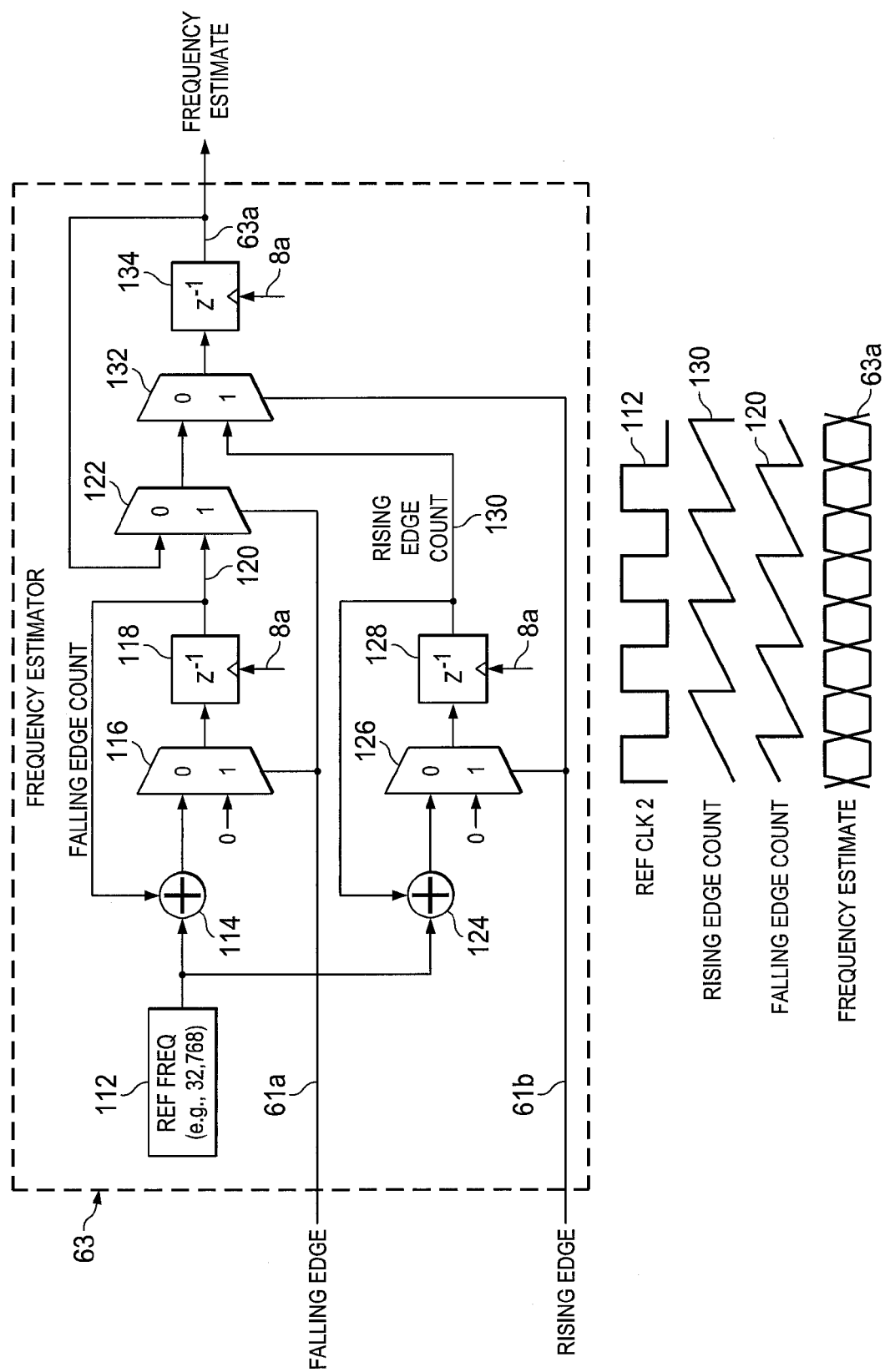
FIG. 5 is a schematic diagram illustrating an exemplary frequency estimator circuit of the FLL in FIGS. 1 and 3.

FIG. 5 illustrates an exemplary frequency estimator circuit 63 which receives the falling and rising edge output signals 61a and 61b from the edge detector 61, and provides a frequency estimate output value 63a representing the frequency of the FLL feedback clock signal 8 (or the divided signal 8a, if the edge detector 69 (FIG. 3) is used) based at least partially on the signals 61a and 61b. The frequency estimator 63 in the example of FIG. 5 includes a reference frequency value 112 (e.g., 32,768) which may be stored in a digital register, as well as a first counter circuit 114, 116, 118 configured to count pulses in the falling edge output signal 61a from the edge detector circuit 61, and a second counter circuit 124, 126, 128 which counts the time between pulses in the rising edge output signal 62a, where the storage elements 118 and 128 of these counter circuits are clocked by the divided VCO signal 8a. In addition, an output circuit 122, 132, 134 is also clocked by the signal 8a and operates to provide the frequency error output value 67a in alternating fashion as a falling edge count value 120 from the first counter circuit 114, 116, 118 in response to a pulse on the falling edge output signal 61a, and then as a rising edge count value 130 from the second counter circuit 124, 126, 128 in response to a pulse on the rising edge output signal 61b. In this manner, the output 63a of the register ($Z^{-1}$) 134 indicates the ratio between the frequency of the signal 8a (VCO/16) and that of the reference clock 62.

The falling edge counter 118 and the rising edge counter 128 store values indicating or otherwise representing the number of positive and negative edges of the second reference clock 62 (FIG. 3), where the counter 118 is reset to 0 at every pulse in the falling edge 61a signal, and the counter 128 is reset to 0 every pulse in the rising edge 61b signal. In between these edges, each counter 118, 128 is incremented by a number equal to the reference frequency value 112 (e.g., 32,768 in one possible implementation) at each VCO clock pulse 8a (VCO/16). The frequency estimator circuit 63 advantageously counts both the rising and falling edges, and thus yields twice the amount of information with lower latency compared to merely counting the rising edges only (or counting the falling edges only). The initial output multiplexer 122 provides the most recent falling edge count 120 value as an output upon the occurrence of each pulse in the falling edge signal 61a, and otherwise outputs the current frequency estimate from the feedback of the output of the storage register 134. At each pulse in the rising edge signal 61b, the second output multiplexer 132 outputs the current rising edge count value to the register 134, and otherwise provides the output from the first output multiplexer 122 to the counter 134. At each divided VCO clock (e.g., each cycle of the signal 8a), the register 134 stores the output from the second output multiplexer 132, and provides the frequency estimate output 63a. It is noted that ideally the rising edges always occur at the same time and the falling edges always occur at the same time, and thus the usage of both the rising and falling edge signals 61 in the frequency estimation advantageously adjusts the charge pump and VCO on roughly equally spaced time intervals, encouraging lower time between corrections. Thus, providing two output updates to the frequency estimate 63a (one based on the rising edge pulse count of signal 61b, and the other based on the falling edge count of signal 61a) allows the FLL 62 advantageously control the VCO 40 more tightly when operating from the FLL 60 than would otherwise be possible if only the falling edges were counted or if only the rising edges were counted to estimate the feedback frequency.

In operation, using a reference frequency value of 32,768, at the rising edge 61b, the counter 128 is 0, and thereafter takes in the FLL reference frequency (32,768), and that gets added by the adder 124 to the output of the counter 128 every cycle of the divided VCO clock signal 8a in which there is no pulse in the rising edge signal 61b. Therefore, each divided VCO clock in which there is not a rising edge 61b of the reference clock, the rising edge count output of the counter 128 is incremented by 32,768, and this continues incrementing until the next rising edge 61b, at which point the counter 128 is again reset to 0. The output multiplexers 122 and 132 copy the current cumulative count each time there is a corresponding edge into the $Z^{-1}$ register 134 in order to form the frequency estimate output 63a. When a rising edge 61b occurs, the rising edge count value 130 is copied to the frequency estimate output storage device 134. Likewise, when a falling edge 61a occurs, the falling edge count value 120 is copied to the output 63a. In this manner, each time there is a rising or falling edge in the feedback clock signal 8a, the frequency estimate output 63a is updated, which is twice the update rate of merely counting rising edges only (or counting falling edges only). This operation is illustrated in the exemplary waveforms shown in FIG. 5 with the gradual increase of the rising edge count 130 and the falling edge count 120, each being reset to zero at the corresponding edge of the second reference clock 62. FIG. 5 further illustrates an exemplary frequency estimate waveform constructed using the values updated at the frequency estimate output 63a.

Figure 6:
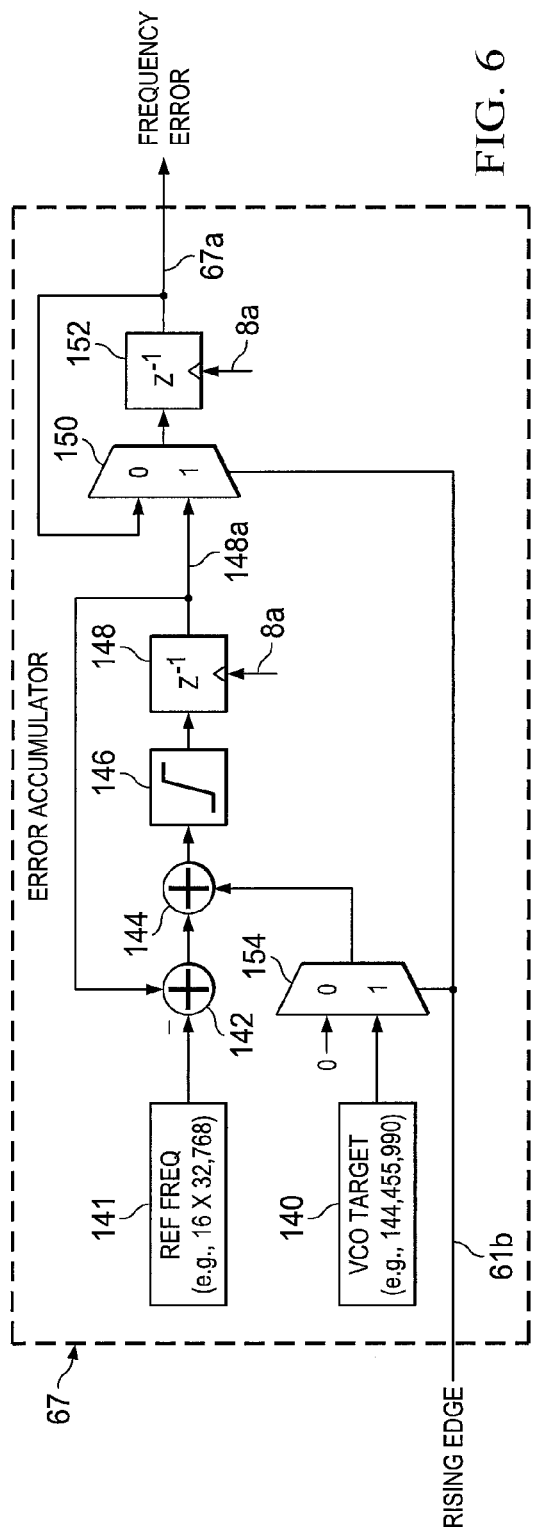
FIG. 6 is a schematic diagram illustrating an exemplary error accumulator circuit in the FLL of FIGS. 1 and 3.
Figure 7:
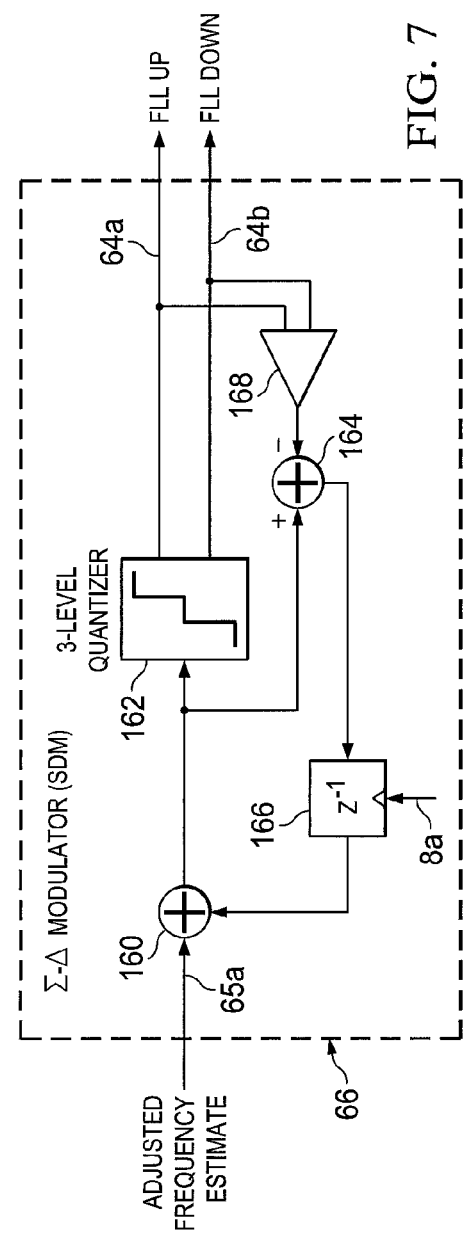
FIG. 7 is a schematic diagram illustrating an exemplary Sigma Delta modulator circuit in the FLL of FIGS. 1 and 3.

Referring also to FIG. 6, an exemplary error accumulator circuit 67 is illustrated, including a first register 140 storing a VCO target value, such as 144,455,990 in one example, as well as a register 141 storing a reference frequency value (e.g., 16×32,768=524,288). The error accumulator 67 monitors one of the edges (e.g., rising edge 61b in FIG. 6) of the reference clock 62 using the VCO target value 140 and the reference frequency value 141, and provides a frequency error output value 67a representing a frequency error in the FLL feedback clock signal 8 (or the divided signaled 8a). Summers 142 and 144, operate together with a saturation clock 146 and a storage register 148 (clocked by the signal 8a in one embodiment) to form an error counter circuit that loads the VCO target count value 140 as an error count value 148a via a multiplexer 154 at each pulse in the rising edge output signal 61b. The saturation block 146 at the output of the adder 144 is a circuit which checks that the output of the adder 144 fits in the digital range of the bus that is passed to the following register 148. For instance, the digital data path between the adder 144 and the register 148 and one non-limiting example can be a 32 bit bus, and the output is 2's complement (i.e. can go negative). Thus, the saturation circuitry 146 checks that the result from the adder 144 is not over $2^{31}-1$ and not under $-2^{31}$. In one possible implementation, this is done in the circuit 146 by adding two or more bits of headroom and ensuring that these bits are always the same, either all ones for negative value or all zeros for a positive value.

The counter circuit then successively decrements the error count value 148a by the reference frequency count value 112 at each cycle of the FLL feedback clock signal 8a. An output circuit is formed by a multiplexer 150 and an output register 152 (also clocked by the signal 8a) which provides the frequency error output value 67a as the error count value 148a at each pulse in the rising edge output signal 62b. In certain embodiments, the values 140 and 141 are stored in the circuit 2 so that the error accumulator 67 adds up in units representing frequency (hertz). As seen above in FIG. 3, moreover, the FLL 60 thus uses the accumulator circuit 67 to accumulate the frequency error, and optionally divides that by 4 or other suitable value via the divider component 68 to provide damping and thus avoid instability or ringing in the error accumulator loop. Because the rising and falling edge counters in the frequency estimator 63 (FIG. 5 above) add the reference frequency value every edge when they are sampled, the estimate may include an error. This error is tracked in the error accumulator circuit 67, and may be low pass filter to reduce overshoot at the expense of lock time in various embodiments.

In one illustrative example, at the rising edge of the reference clock 62, the value 144,455,990 is added to the counter value 148a of the register 148. Then, at every VCO/16 clock cycle 8a, the value 32,768*16 (524,288) is subtracted, such that the value 148a counts down 143,931,702; 143,407,414, etc., until the next rising edge pulse 61b, where the value 148a should ideally be zero. For example, if the final value is 17, this value is coped into the register 152 and the summer 144 adds 144,455,990 back in. Thus, the register 148 starts at 144,456,007 and counts down again 143,931,719; 143,407, 431; 142,883,143, etc. The closed loop operation of the FLL in conjunction with the charge pump 30 and the VCO 40 (FIGS. 1 and 2) causes the VCO 40 to decrease its output frequency by the FLL SDM 66 (FIG. 3) applying a FLL down pulse 64b to the charge pump 30, such that the frequency error is gradually moved closer to zero when the next rising edge arrives. Thus, at each rising edge in the example of FIG. 6, the VCO target value (e.g., 144,455,990) is added to the error estimate, and thereafter until the next rising edge, the reference clock frequency target value (e.g., 32,768) is subtracted at every VCO/16 clock 8a. If the reference frequency is correct, the counter should ideally reach zero each rising edge, but may not be exactly 0. Therefore, at every rising edge, the most recent estimate of the error is output at 67a, and divided by 4 at 68 (FIG. 3). This error 68a is then added to the frequency estimate output 63a of the frequency estimator 63 by the adder 65 (FIG. 3), and the adjusted estimate 65a is provided as an input to the SDM 66 (FIG. 3).

Referring also to FIG. 7, an exemplary FLL SDM (Sigma Delta modulator) circuit 66 is shown, including a summer 160 receiving the adjusted frequency estimate value 65a from the summation of the divided frequency error value 68a and the frequency estimate value 63a from the frequency estimator 63 (FIG. 3). The output of the summer 160 is provided as an input to a three-level quantizer circuit 162 which provides the FLL up signal 64a and the FLL down signal 64b to the multiplexer 20 (FIG. 1) based at least partially on the frequency estimate output value 63a and the frequency error output value 67a. The quantizer 162 also provides the up and down signals 64 to a gain circuit 168 that provides an output to a summer 164. The gain circuit 168 takes the two single-bit FLL up and down outputs 64a and 64b and provides a feedback output of a magnitude depending on the size of the error and/or the ratio between input and VCO target clock frequencies, and the gain circuit 168 in certain embodiments provides an adjustable override to allow a user to trade-off between overshoot and lock time. The summer 164 subtracts the output of the gain circuit 68 from the output of the summer 160 to form an error value provided to a register 166 that is clocked by the scaled feedback clock signal 8a. The output of the register 166 is provided as an input to the summer 160. If the frequency estimate was too high, the SDM 66 provides a pulse on the FLL down signal 64b. If the estimate was too low, the SDM 66 provides an FLL up pulse 64a. Those are provided to the charge pump 30 via the multiplexer 20 (FIGS. 1 and 2) for adjusting the VCO 40.

Figure 8:
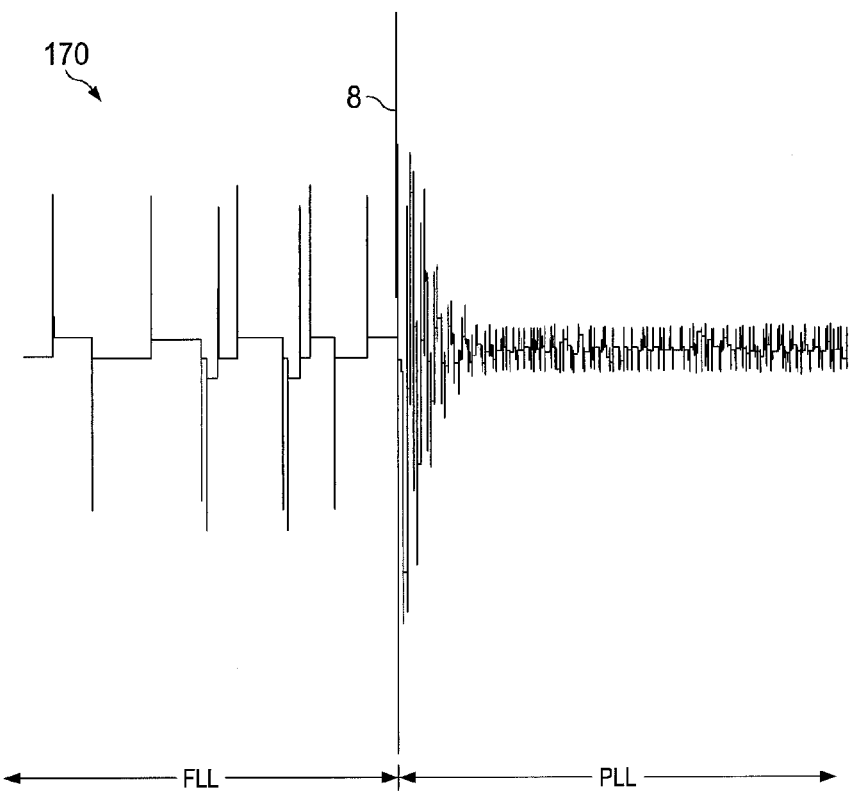
FIG. 8 is a waveform diagram illustrating simulated operation of the hybrid PLL/FLL circuit of FIG. 1 in switching from FLL operation to PLL operation.
Figure 9:
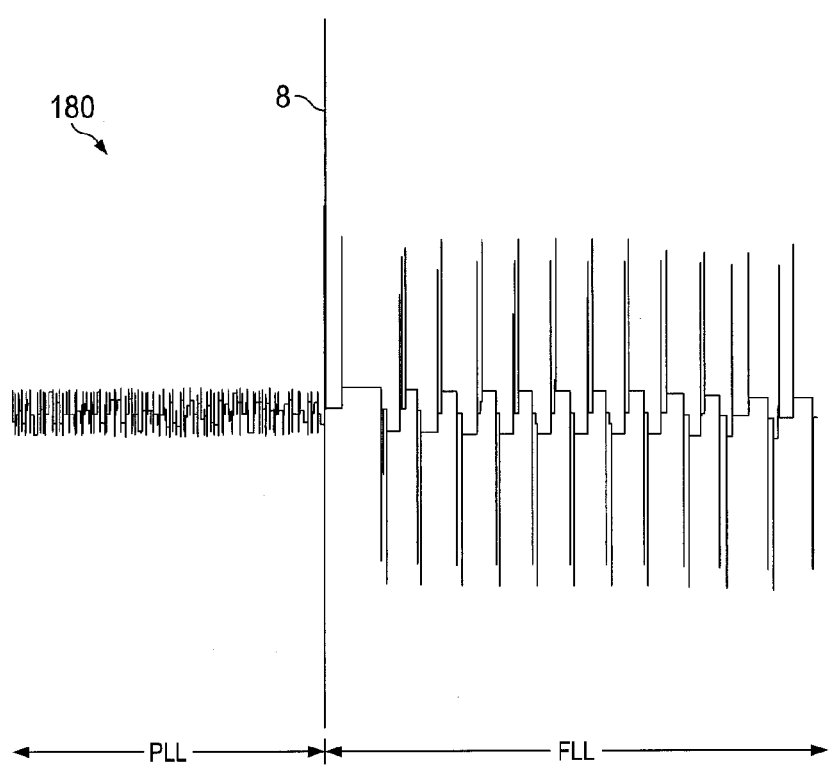
FIG. 9 is a waveform diagram illustrating simulated operation of the hybrid PLL/FLL circuit of FIG. 1 during a change from PLL operation to FLL operation.

FIGS. 8 and 9 illustrate simulated VCO output waveforms 8 in the circuit 2 in switching from FLL operation to PLL operation (graph 170 in FIG. 8) and in switching from PLL operation to FLL operation (graph 180 in FIG. 9). As seen in the waveforms 8, the hybrid PLL/FLL circuit 2 advantageously mitigates or avoids loss of clock pulses in transitioning between high and low frequency operation, and provides acceptable levels of glitch or noise in the clock signal 8. This is a significant improvement over conventional approaches which employ dedicated PLL circuits for each reference clock source in conjunction with a clock hand over circuit. Moreover, as discussed above, the disclosed circuitry requires minimal additional circuitry and incorporates the up and down signaling of the FLL into the charge pump/VCO forward path of the PLL circuit 4 with simple addition of the multiplexer circuit 20 to facilitate digital locking of the secondary clock source 62 when needed or desired. While the above examples are illustrated in the context of first and second reference clock signals 6 and 62, respectively, other embodiments are possible in which three or more clock sources may be selectively employed using corresponding multiplexer circuitry 20 to accommodate up and down signals from the PFD 10 for the primary clock source as well as up and down signals from two or more auxiliary FLL circuit 60 and associated reference clock sources 62.

The above examples are merely illustrative of several possible embodiments of various aspects of the present disclosure, wherein equivalent alterations and/or modifications will occur to others skilled in the art upon reading and understanding this specification and the annexed drawings. In addition, although a particular feature of the disclosure may have been disclosed with respect to only one of multiple implementations, such feature may be combined with one or more other features of other embodiments as may be desired and advantageous for any given or particular application. Also, to the extent that the terms "including", "includes", "having", "has", "with", or variants thereof are used in the detailed description and/or in the claims, such terms are intended to be inclusive in a manner similar to the term "comprising".

What is claimed is:

1. A circuit for selectively providing a clock signal according to one of a plurality of reference clock signals, comprising:
    a locking circuit, comprising:
        a phase frequency detector (PFD), comprising:
            a first PFD input to receive a locking circuit reference clock signal,
            a second PFD input to receive a feedback clock signal,
            a first PFD output providing a locking circuit up signal, and
            a second PFD output providing a locking circuit down signal,
        a control circuit with a first control circuit input to receive an up signal, a second control circuit input to receive a down signal, and a control circuit output providing a control output signal,
        a controlled oscillator providing an oscillator output clock signal having a frequency determined at least partially according to the control output signal from the control circuit, and
        a feedback circuit providing the feedback clock signal to the PFD at least partially according to the oscillator output clock signal from the controlled oscillator;
    a frequency lock loop (FLL), comprising:
        a first FLL input to receive an FLL reference clock signal,
        a second FLL input to receive an FLL feedback clock signal,
        a first FLL output providing an FLL up signal, and
        a second FLL output providing an FLL down signal; and
    a multiplexer circuit configured to selectively provide one of the locking circuit up signal and the FLL up signal to the first control circuit input according to a reference clock select signal, and to selectively provide one of the locking circuit down signal and the FLL down signal to the second control circuit input according to the reference clock select signal,
    wherein the multiplexer circuit comprises:
        a first multiplexer, comprising:
            a first input coupled to receive the FLL up signal from the first FLL output,
            a second input coupled to receive the locking circuit up signal from the first PFD output, and
            a first multiplexer output configured to selectively provide one of the locking circuit up signal and the FLL up signal to the first control circuit input according to the reference clock select signal; and
        a second multiplexer, comprising:
            a first input coupled to receive the FLL down signal from the second FLL output,
            a second input coupled to receive the locking circuit down signal from the second PFD output, and
            a second multiplexer output configured to selectively provide one of the locking circuit down signal and the FLL down signal to the second control circuit input according to the reference clock select signal.

2. The circuit of claim 1, wherein the locking circuit comprises a low pass filter circuit coupled to the control circuit output and to an input of the controlled oscillator.

3. The circuit of claim 1, wherein the FLL comprises:
    an edge detector circuit coupled with the first FLL input and configured to provide a falling edge output signal in response to detection of falling edges in the FLL reference clock signal, and to provide a rising edge output signal in response to detection of rising edges in the FLL reference clock signal;
    a frequency estimator circuit, receiving the falling edge output signal and the rising edge output signal from the edge detector circuit, and configured to provide a frequency estimate output value representing the frequency of the FLL feedback clock signal at least partially according to the falling edge output signal and the rising edge output signal; and
    a Sigma-Delta modulator (SDM) circuit coupled with the frequency estimator circuit and configured to provide the FLL up signal at the first FLL output, and to provide the FLL down signal at the second FLL output at least partially according to the frequency estimate output value from the frequency estimator circuit.

4. The circuit of claim 3, wherein the FLL comprises an error accumulator circuit coupled with the edge detector circuit and configured to provide a frequency error output value representing a frequency error in the FLL feedback clock signal, and wherein the SDM circuit is coupled with the error accumulator circuit and is configured to provide the FLL up signal and the FLL down signal at least partially according to the frequency estimate output value and the frequency error output value.

5. The circuit of claim 3, wherein the FLL comprises a divider circuit receiving the FLL feedback clock signal and providing a divided FLL feedback clock signal at a frequency lower than the frequency of the FLL feedback clock signal, and wherein the edge detector circuit is coupled with the divider circuit and configured to provide the falling edge output signal in response to detection of falling edges in the FLL reference clock signal using the divided FLL feedback clock signal, and to provide the rising edge output signal in response to detection of rising edges in the FLL reference clock signal using the divided FLL feedback clock signal (8a).

6. The circuit of claim 1, wherein the feedback circuit comprises:
a feedback divider circuit operative to divide the oscillator output clock signal from the controlled oscillator by a first integer value to provide the feedback clock signal to the PFD as a first divided oscillator output clock signal at a first frequency lower than the frequency of the oscillator output clock signal; and
a feedback divider Sigma-Delta modulator (SDM) circuit configured to adjust the feedback divider circuit at least partially according to the divided oscillator output clock signal.

7. The circuit of claim 6, wherein the feedback circuit comprises:
a low power divider circuit configured to divide the oscillator output clock signal from the controlled oscillator to provide the feedback clock signal to the PFD as a second divided oscillator output clock signal at a second frequency lower than the first frequency and lower than the frequency of the oscillator output clock signal; and
a divider multiplexer circuit configured to selectively provide the feedback clock signal to the PFD as one of the first divided oscillator output clock signal and the second divided oscillator output clock signal according to a divider select signal.

8. The circuit of claim 1, wherein the locking circuit comprises a lock detect circuit configured to provide a locking circuit lock output signal indicating that the oscillator output clock signal is substantially locked to the locking circuit reference clock signal at least partially according to the locking circuit reference clock signal and the feedback clock signal.

9. The circuit of claim 1, wherein the control circuit is a charge pump circuit.

10. The circuit of claim 1, wherein the locking circuit is a phase lock loop (PLL) circuit.

11. A clock circuit, comprising:
a phase lock loop (PLL), comprising:
a phase frequency detector (PFD) configured to provide PLL up and down output signals based on a PLL reference clock signal and a feedback clock signal,
a charge pump configured to provide a control voltage output signal according to received up and down input signals,
a controlled oscillator providing an oscillator output clock signal according to the control voltage output signal;
a frequency lock loop (FLL), configured to provide FLL up and down signals based on an FLL reference clock signal and an FLL feedback clock signal; and
a multiplexer circuit configured to selectively provide the up and down signals from one of the PFD and the FLL to the charge pump according to a reference clock select signal.

12. The clock circuit of claim 11, wherein the PFD comprises a comparison circuit configured to selectively provide a PLL up output signal or a PLL down output signal at least partially according to a comparison of the PLL reference clock signal to the feedback clock signal.

13. The clock circuit of claim 11, wherein the multiplexer circuit comprises:
a first multiplexer, comprising:
a first input coupled to receive the FLL up signal from the FLL,
a second input coupled to receive the PLL up signal from the PLL, and
a first multiplexer switching circuit configured to selectively provide one of the PLL up signal and the FLL up signal to the charge pump according to the reference clock select signal; and
a second multiplexer, comprising:
a first input coupled to receive the FLL down signal from the FLL,
a second input coupled to receive the PLL down signal from the PLL, and
a second multiplexer switching circuit configured to selectively provide one of the PLL down signal and the FLL down signal to the charge pump according to the reference clock select signal.

14. The clock circuit of claim 13, wherein the FLL comprises:
an edge detector circuit providing a falling edge output signal according to falling edges in the FLL reference clock signal, and providing a rising edge output signal according to rising edges in the FLL reference clock signal;
a frequency estimator circuit providing a frequency estimate output value representing the frequency of the FLL feedback clock signal at least partially according to the falling edge output signal and the rising edge output signal;
an error accumulator circuit providing a frequency error output value representing a frequency error in the FLL feedback clock signal; and
a Sigma-Delta modulator (SDM) circuit providing the FLL up signal and the FLL down signal at least partially according to the frequency estimate output value and the frequency error output value.

15. The clock circuit of claim 14, wherein the frequency estimator circuit comprises:
a first counter circuit configured to count pulses in the falling edge output signal from the edge detector circuit;
a second counter circuit configured to count pulses in the rising edge output signal from the edge detector circuit; and
an output circuit configured to provide frequency error output value in alternating fashion as a falling edge count value from the first counter circuit in response to a pulse on the falling edge output signal and a rising edge count value from the second counter circuit in response to a pulse on the rising edge output signal.

16. The clock circuit of claim 11, wherein the FLL comprises:
an edge detector circuit providing a falling edge output signal according to falling edges in the FLL reference clock signal, and providing a rising edge output signal according to rising edges in the FLL reference clock signal;

a frequency estimator circuit providing a frequency estimate output value representing the frequency of the FLL feedback clock signal at least partially according to the falling edge output signal and the rising edge output signal;

an error accumulator circuit providing a frequency error output value representing a frequency error in the FLL reference clock signal; and a Sigma-Delta modulator (SDM) circuit providing the FLL up signal and the FLL down signal at least partially according to the frequency estimate output value and the frequency error output value.

17. The clock circuit of claim 16, wherein the frequency estimator circuit comprises:

a first counter circuit configured to count pulses in the falling edge output signal from the edge detector circuit;

a second counter circuit configured to count pulses in the rising edge output signal from the edge detector circuit; and an output circuit configured to provide frequency error output value in alternating fashion as a falling edge count value from the first counter circuit in response to a pulse on the falling edge output signal and then as a rising edge count value from the second counter circuit in response to a pulse on the rising edge output signal.

18. The clock circuit of claim 14, wherein the error accumulator circuit comprises:

an error counter circuit that loads a controlled oscillator target count value as an error count value at each pulse in a first one of the falling edge output signal and the rising edge output signal, and successively decrements the error count value by a reference frequency count value at each cycle of the FLL feedback clock signal; and an output circuit that provides the frequency error output value as the error count value at each pulse in the first one of the falling edge output signal and the rising edge output signal.

19. A circuit for selectively providing a clock signal according to one of a plurality of reference clock signals, comprising:

a phase lock loop (PLL), comprising: a phase frequency detector (PFD) configured to provide PLL up and down output signals based on a PLL reference clock signal and a feedback clock signal, a charge pump configured to provide a control voltage output signal according to received up and down input signals, a controlled oscillator providing an oscillator output clock signal according to the control voltage output signal;

a frequency lock loop (FLL), configured to provide FLL up and down signals based on an FLL reference clock signal and an FLL feedback clock signal, the FLL comprising:

an edge detector circuit providing a falling edge output signal according to falling edges in the FLL reference clock signal, and providing a rising edge output signal according to rising edges in the FLL reference clock signal, a frequency estimator circuit providing a frequency estimate output value representing the frequency of the FLL feedback clock signal at least partially according to the falling edge output signal and the rising edge output signal, the frequency estimator circuit comprising:

a first counter circuit configured to count pulses in the falling edge output signal from the edge detector circuit, a second counter circuit configured to count pulses in the rising edge output signal from the edge detector circuit, and an output circuit configured to provide a frequency error output value in alternating fashion as a falling edge count value from the first counter circuit in response to a pulse on the falling edge output signal and a rising edge count value from the second counter circuit in response to a pulse on the rising edge output signal, an error accumulator circuit providing a frequency error output value representing a frequency error in the FLL feedback clock signal, the error accumulator circuit comprising:

an error counter circuit that loads a controlled oscillator target count value as an error count value at each pulse in a first one of the falling edge output signal and the rising edge output signal, and successively decrements the error count value by a reference frequency count value at each cycle of the FLL feedback clock signal; and an output circuit that provides the frequency error output value as the error count value at each pulse in the first one of the falling edge output signal and the rising edge output signal, and a Sigma-Delta modulator (SDM) circuit providing the FLL up signal and the FLL down signal at least partially according to the frequency estimate output value and the frequency error output value; and a multiplexer circuit comprising a first multiplexer configured to selectively provide one of the PLL up signal and the FLL up signal to the charge pump according to a reference clock select signal, and a second multiplexer configured to selectively provide one of the PLL down signal and the FLL down signal to the charge pump according to the reference clock select signal.

* * * * *